(12) United States Patent
Jang et al.

(10) Patent No.: US 9,257,675 B2
(45) Date of Patent: Feb. 9, 2016

(54) SUBSTRATE FOR AN ORGANIC ELECTRONIC DEVICE AND AN ORGANIC ELECTRONIC DEVICE COMPRISING THE SAME

(75) Inventors: Seong Su Jang, Daejeon (KR); Yeon Keun Lee, Daejeon (KR); Kyoung Sik Moon, Daejeon (KR); Se Hwan Son, Daejeon (KR)

(73) Assignee: LG CHEM, LTD., Seoul (KR)

( * ) Notice: Subject to any disclaimer, the term of this patent is extended or adjusted under 35 U.S.C. 154(b) by 73 days.

(21) Appl. No.: 13/819,308

(22) PCT Filed: Sep. 6, 2011

(86) PCT No.: PCT/KR2011/006579
§ 371 (c)(1),
(2), (4) Date: Oct. 2, 2013

(87) PCT Pub. No.: WO2012/033322
PCT Pub. Date: Mar. 15, 2012

(65) Prior Publication Data
US 2014/0014923 A1    Jan. 16, 2014

(30) Foreign Application Priority Data

Sep. 6, 2010   (KR) .................. 10-2010-0087090
Feb. 11, 2011  (KR) .................. 10-2011-0012493

(51) Int. Cl.
*H01L 51/52*   (2006.01)
*B32B 5/16*    (2006.01)
*B32B 7/02*    (2006.01)
(Continued)

(52) U.S. Cl.
CPC .......... *H01L 51/5268* (2013.01); *G02B 5/0242* (2013.01); *H01L 51/56* (2013.01); *H05B 33/22* (2013.01); *H01L 51/0096* (2013.01); *H01L 51/5076* (2013.01); *H01L 2251/55* (2013.01)

(58) Field of Classification Search
None
See application file for complete search history.

(56) References Cited

U.S. PATENT DOCUMENTS

2003/0127973 A1   7/2003   Weaver et al.
2006/0049745 A1   3/2006   Handa et al.
(Continued)

FOREIGN PATENT DOCUMENTS

EP   1445095 A1      8/2004
JP   2004-327070 A   11/2004
(Continued)

OTHER PUBLICATIONS

Machine translation of JP 2005-353367 A (Dec. 2005).*
(Continued)

*Primary Examiner* — Marie R. Yamnitzky
(74) *Attorney, Agent, or Firm* — Dentons US LLP

(57) ABSTRACT

A substrate including a base substrate; a scattering layer which is formed on the base substrate, includes a binder and scattering particles for scattering light, and has an uneven structure formed on a surface thereof opposite the base substrate; and a planarizing layer which is formed on the scattering layer and has a flat surface formed thereon, is provided. Here, the refractive index Na of the scattering particles and the refractive index Nb of the planarizing layer satisfy the expression |Na−Nb|≥0.3, an organic electronic device including the substrate, and a method of manufacturing the same are provided. Light-extraction efficiency can be improved and the manufacturing process can be simplified without degrading device performance.

18 Claims, 2 Drawing Sheets

(51) Int. Cl.
*H05B 33/22* (2006.01)
*G02B 5/02* (2006.01)
*H01L 51/56* (2006.01)
*H01L 51/00* (2006.01)
*H01L 51/50* (2006.01)

(56) References Cited

U.S. PATENT DOCUMENTS

2006/0051613 A1* 3/2006 Tomita et al. .................. 428/690
2007/0228948 A1 10/2007 Miura

FOREIGN PATENT DOCUMENTS

| | | |
|---|---|---|
| JP | 2005-353367 A | 12/2005 |
| JP | 2007-134339 A | 5/2007 |
| JP | 2007-294901 A | 11/2007 |
| JP | 2012-504847 A | 2/2012 |
| KR | 10-2005-0111348 | 11/2005 |
| KR | 1020070024487 A | 3/2007 |
| KR | 10-2009-0019752 | 2/2009 |
| KR | 10-2009-0019753 | 2/2009 |
| KR | 1020100037572 A | 4/2010 |
| KR | 10-2010-0063729 | 6/2010 |
| WO | 2010/039009 A3 | 4/2010 |

OTHER PUBLICATIONS

CRC Handbook of Chemistry and Physics, Internet Version 2016, W. M. Haynes, Ph.D. editor-in-chief, CRC Press, pp. 4-138 through 4-144, 10-240 through 10-244, 12-126 and 12-144.*

* cited by examiner

SUBSTRATE FOR AN ORGANIC ELECTRONIC DEVICE AND AN ORGANIC ELECTRONIC DEVICE COMPRISING THE SAME

CROSS-REFERENCE TO RELATED APPLICATION

This application is a National Stage Entry of International Application No. PCT/KR2011/006579, filed Sep. 6, 2011, and claims the benefit of Korean Application No. 10-2010-0087090, filed on Sep. 6, 2010 and Korean Application No. 10-2011-0012493, filed Feb. 11, 2011, which are hereby incorporated by reference in their entirety for all purposes as if fully set forth herein.

BACKGROUND

1. Field of the Invention

The present invention relates to a substrate for an organic electronic device having a novel structure, an organic electronic device including the substrate, and a method of manufacturing the same.

2. Discussion of Related Art

An organic electronic device refers to a device that can induce the flow of electric charge between an electrode and an organic material using holes and/or electrons. The organic electronic device is a type of electronic device used as a current source since excitons formed in an organic material layer are separated into electrons and holes by means of photons flowing into the device from an external light source according to its operation principle, and the separated electrons and holes are transferred to different electrodes; or a type of electronic device which is driven by electrons and holes which are injected into an organic material by applying a voltage or electric current to two or more electrodes. Examples of an organic electronic device include an organic light emitting diode (OLED), an organic solar cell, an organic photoconductor (OPC) drum or organic transistor, etc.

The OLED refers to a spontaneously light emitting device using electroluminescence in which light emits when an electric current flows in a light-emissive organic compound. The OLED has attracted much attention as a next-generation material in various fields such as displaying or lighting since the OLED has advantages in that it has excellent thermal stability and low drive voltage.

SUMMARY OF THE INVENTION

The present invention is directed to providing a substrate for an organic electronic device having a novel structure which is able to improve light extraction efficiency without degrading device performance, and a method of manufacturing the same.

Also, the present invention is directed to providing an organic electronic device having improved electron transfer efficiency and luminous efficiency without requiring a separate electron injection layer (EIL), and a method of manufacturing the same.

One aspect of the present invention provides a substrate for an organic electronic device and a method of manufacturing the same. Here, the substrate may include a base substrate; a scattering layer which is formed on the base substrate, includes a binder and scattering particles for scattering light and has an uneven structure formed on a surface thereof opposite the base substrate; and a planarizing layer which is formed on the scattering layer to planarize an uneven surface of the scattering layer. Another aspect of the present invention provides an organic electronic device including the substrate. Here, refractive index Na of the scattering particles and a refractive index Nb of the planarizing layer satisfy the expression $|Na-Nb|\geq 0.3$.

Still another aspect of the present invention provides an organic electronic device including the substrate and a method of manufacturing the same. The organic electronic device may have a sequentially stacked structure including the substrate as described above; a first electrode; an organic layer including a light emitting layer (LEL); and a second electrode. Here, the organic layer includes an electron transfer layer (ETL) doped with an alkali halide, and the ETL doped with the alkali halide may be formed to have a thickness of 40 to 100 nm.

DETAILED DESCRIPTION OF EXEMPLARY EMBODIMENTS

Figure 1:
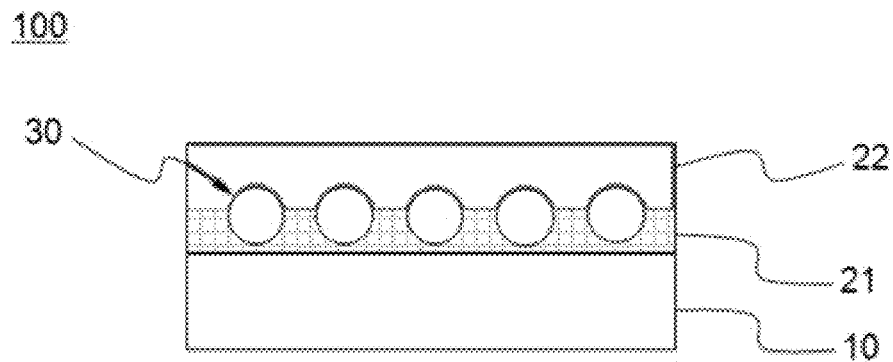
FIG. 1 is a schematic diagram showing a cross section of a substrate for an organic electronic device according to one exemplary embodiment of the present invention.

The substrate for an organic electronic device according to one exemplary embodiment of the present invention may include a base substrate; a scattering layer which is formed on the base substrate, includes a binder and scattering particles for scattering light and has an uneven structure formed on a surface thereof opposite the base substrate; and a planarizing layer which is formed on the scattering layer to planarize an uneven surface of the scattering layer. Also, the present invention provides an organic electronic device including the substrate. In addition, a refractive index Na of the scattering particles and a refractive index Nb of the planarizing layer may satisfy the expression $|Na-Nb|\geq 0.3$.

In addition, the present invention provides a method of manufacturing the substrate, an organic electronic device including the substrate, and a method of manufacturing the organic electronic device.

As the difference in refractive index between the scattering particles and the planarizing layer increases, scattering of light directed from the planarizing layer to the scattering layer may be significantly increased, thereby minimizing reflection loss caused by the difference in refractive index in the device.

In the case of the organic electronic device, for example, an organic light emitting device, internal total reflection takes place due to the difference in refractive index between layers constituting the device. More particularly, primary total reflection of light generated in the organic material layer takes place at the interface between a transparent electrode having a refractive index of 1.8 or more and a glass substrate having a refractive index of 1.5 or more. Also, secondary total reflection of light passed through the glass substrate also takes place at the interface between a glass substrate having a refractive index of 1.8 and air having a refractive index of 1.0.

Such internal total reflection of the device may degrade luminous efficiency and brightness. According to the present invention, the reduction of luminous efficiency caused by such internal reflection of the organic electronic device may be improved, and excellent luminous uniformity may be provided.

The substrate for an organic electronic device according to one exemplary embodiment of the present invention may improve luminous uniformity of the device and enhance light extraction efficiency. More particularly, according to one exemplary embodiment, the scattering particles may have a refractive index Na of 1.0 to 2.0, and the planarizing layer may have a refractive index Nb of 1.7 to 2.5. Specifically, the refractive index Na of the scattering particles may be in a range of 1.2 to 1.8, and the refractive index Nb of the planarizing layer may be in a range of 1.8 to 2.0. According to further exemplary embodiment, the refractive index Na of the scattering particles may be in a range of 2.0 to 3.5, and the refractive index Nb of the planarizing layer may be in a range of 1.7 to 2.5. Specifically, the refractive index Na of the scattering particles may be in a range of 2.2 to 3.0, and the refractive index Nb of the planarizing layer may be in a range of 1.8 to 2.0.

In the present invention, the refractive index is obtained by measuring the refractive index for light with 400 to 450 nm wavelengths under a vacuum condition.

The base substrate is not particularly limited, and may be a transparent base substrate. For example, the base substrate may be a light-transmissive plastic substrate or a glass substrate.

The scattering particles are not particularly limited as long as they can scatter light using the difference in refractive index between the scattering particles and the planarizing layer. For example, the scattering particles may be at least one selected from the group consisting of silicon, silica, glass, titanium oxide, magnesium fluoride, zirconium oxide, alumina, cerium oxide, hafnium oxide, niobium pentoxide, tantalum pentoxide, indium oxide, tin oxide, indium tin oxide (ITO), zinc oxide, silicon, zinc sulfide, calcium carbonate, barium sulfate, silicon nitride and aluminum nitride.

The scattering particles may be formed on the base substrate through bonding with the binder, and may be formed in a single-layer or multiple-layer structure or a randomly stacked structure. Specifically, the scattering particles may be formed on the base substrate in a single-layer structure. Since light may be uniformly dispersed when the scattering particles are formed in a single-layer structure, light can emit uniformly from a light emitting surface.

The scattering particles may have a spherical, oval or amorphous shape, preferably a spherical or oval shape. An average diameter of the scattering particles may be in a range of 0.01 µm to 20 µm, preferably in a range of 0.1 to 5 µm.

The binder in the scattering layer is not particularly limited, and may be an organic and inorganic, or organic/inorganic complex binder. According to one exemplary embodiment, the binder may be an inorganic or organic/inorganic complex binder. The inorganic or organic/inorganic complex binder is desirable for performance, especially life span, of the device due to excellent heat resistance and chemical resistance compared with an organic binder. Also, the inorganic or organic/inorganic complex binder may be useful in manufacturing various devices since the inorganic or organic/inorganic complex binder is not easily degraded during a process which may be realized in a process of manufacturing a device such as a high temperature process which is performed at 150° C. or more, a photo process and a etching process. Specifically, the binder may be at least one selected from the group consisting of silicon oxide, silicon nitride, silicon oxynitride, alumina and an inorganic or organic/inorganic complex based on a siloxane bond (Si—O). For example, an inorganic binder based on a [Si—O] bond may be formed using a siloxane through condensation polymerization, or a type of organic/inorganic complex in which an alkyl group is not completely removed from the siloxane bond may be used herein.

The planarizing layer may include a binder such as an inorganic material, or an inorganic or organic/inorganic complex. Examples of the planarizing layer are not particularly limited, but the planarizing layer may include at least one selected from the group consisting of silicon nitride, silicon oxynitride, alumina and an inorganic or organic/inorganic complex based on a siloxane bond (Si—O).

The planarizing layer may further include a high-refractive index filler. The high-refractive index filler functions to reduce a difference in refractive index between the planarizing layer and an organic material layer. The high-refractive index filler is not particularly limited as long as it can be dispersed in the planarizing layer to enhance the refractive index. For example, the high-refractive index filler may be at least one selected from the group consisting of alumina, aluminum nitride, zirconium oxide, titanium oxide, cerium oxide, hafnium oxide, niobium pentoxide, tantalum pentoxide, indium oxide, tin oxide, ITO, zinc oxide, silicon, zinc sulfide, calcium carbonate, barium sulfate and silicon nitride. Preferably, the high-refractive index filler may be titanium dioxide.

The thickness of the planarizing layer may be properly adjusted according to device characteristics. To improve light extraction efficiency, the average thickness of the planarizing layer may be more than 0.5 times or twice the average diameter of the scattering particles, for example, 0.5 to 10 times or 1 to 5 times the average diameter of the scattering particles.

The present invention provides an organic electronic device including the substrate for an organic electronic device as described above.

The organic electronic device according to one exemplary embodiment of the present invention has a sequentially stacked structure including the substrate for an organic electronic device as described above, a first electrode, an organic layer including a light emitting layer (LEL), and a second electrode. Here, the organic layer includes an electron transfer layer (ETL) doped with an alkali halide, $MgF_2$ or $CaF_2$, and the ETL doped with the alkali halide, $MgF_2$ or $CaF_2$ is characterized in that it has a thickness of 40 to 100 nm.

The carrier density for electrons may be enhanced, and an energy barrier for injecting electrons may be reduced by doping the ETL with an alkali halide, $MgF_2$ or $CaF_2$. In particular, when the ETL doped with the alkali halide, $MgF_2$, or $CaF_2$ are formed to have a thickness of 40 to 100 nm, more particularly, 55 to 85 nm, the organic electronic device may be effectively driven even when the EIL which has been considered to be an essential component in a conventional organic electronic device, is not separately formed.

The organic electronic device according to one exemplary embodiment of the present invention has a light-extraction structure in which the scattering particles are formed in the substrate. In the stacked structure in which layers are formed on the substrate, the ETL doped with the alkali halide, $MgF_2$, or $CaF_2$ is configured to have a relatively large thickness. Accordingly, light extraction efficiency may be improved, and an increase in life span of the device and simplification of the manufacturing process may also be facilitated by simplifying a stacked structure of the organic electronic device.

The ETL includes an electron transfer material and an alkali halide, $MgF_2$, or $CaF_2$ with which the electron transfer material is doped. Here, the electron transfer material may include a compound containing at least one functional group selected from the group consisting of an imidazole group, an oxazole group, a thiazole group, a quinoline group and a phenanthroline group. The electron transfer material is not particularly limited, and may be readily selected by those skilled in the related art according to desired physical properties as long as it does not hinder the transfer of electrons.

The alkali halide, $MgF_2$, or $CaF_2$ with which the ETL is doped may improve characteristics of electron injection and transfer from the electrode to the LEL, and preferably, improve the life span of the device. Examples of such an alkali halide includes at least one or a mixture of two or more selected from the group consisting of NaF, CsF, LiF, and KF.

The content of the doped alkali halide in the ETL may be selected within a range in which device performance is not degraded. For example, the content of the doped alkali halide may be 0.1% by weight or more, based on the total weight of the ETL. When the content of the alkali halide is excessively low, it is difficult to expect the technical effects achieved by doping with the alkali halide.

According to one exemplary embodiment, the ETL may be doped with the alkali halide so that the alkali halide can have a concentration gradient according to the thickness of the ETL. Electron transfer characteristics may be further improved by sequentially increasing the doping amount of the alkali halide according to the thickness of the ETL, compared with when the entire region of the ETL is uniformly doped with the alkali halide.

Also, the ETL may perform introduction and transfer of electrons at the same time. In the present invention, a structure in which the EIL is not separately formed, or a structure in which the ETL and EIL are formed as one layer is provided. That is, such a structure may be a structure in which the ETL doped with the alkali halide and the second electrode come in direct contact with each other. However, a case in which the EIL is formed as a separate layer is not excluded in the present invention.

The organic layer stacked in the organic electronic device according to one exemplary embodiment of the present invention may include only (both) an LEL and an ETL doped with an alkali halide. However, the organic layer may include at least one layer selected from the group consisting of a hole injection layer (HIL), a hole transfer layer (HTL) and an electron injection layer (EIL), as necessary. In this case, some of the layers may be omitted or further provided, but the present invention is limited thereto. For example, an arylamine-based compound, a conductive polymer, or a block copolymer having both a conjugated region and a non-conjugated region may be used as the HTL or HIL. The organic layer may have a structure in which the HIL, the HTL, the LEL, the ETL and the EIL are stacked.

Also, the organic electronic device may include a metal wiring formed between the first electrode and the organic layer. The metal wiring functions to compensate for a voltage drop of the first electrode. Accordingly, it is possible to uniformly apply a voltage to the entire surface of the first electrode.

A transparent electrode may be used as the first electrode. For example, ITO, indium zinc oxide (IZO), $SnO_2$, carbon nanotube (CNT) or grapheme may be used as the first electrode. Also, various kinds of metal thin films may be used as the second electrode. For example, an aluminum thin film may be used as the second electrode. In the present invention, kinds of the first and second electrodes are not particularly limited, and various kinds of materials or shapes are applicable to the first and second electrodes.

Also, the present invention provides a method of manufacturing the substrate for an organic electronic device as described above.

According to one exemplary embodiment, the manufacturing method may include forming a scattering layer on a base substrate using a coating solution including a binder and scattering particles, and forming a planarizing layer on the formed scattering layer to have a planarized surface.

The scattering layer may be formed using a method such as CVD, PVD or sol-gel coating. For example, the forming of the scattering layer may include coating the base substrate with a coating solution including an inorganic or organic/inorganic complex binder and scattering particles, and forming a matrix through condensation reaction of the binder included in the coating solution. An uneven structure may be formed by the presence of the scattering particles during condensation of the binder included in the coating solution.

Also, the planarizing layer may be formed using a method such as CVD, PVD or sol-gel coating. For example, the forming of the planarizing layer may include coating the scattering layer with a coating solution including an inorganic binder and a high-refractive index filler, and forming a matrix through condensation reaction of the binder included in the coating solution.

In addition, the present invention provides a method of manufacturing an organic electronic device using the substrate manufactured by the method as described above.

According to one exemplary embodiment, the manufacturing method includes forming a first electrode on the substrate, forming an organic layer including an LEL on the first electrode, and forming a second electrode on the organic layer. Here, the forming of the organic layer may include forming an ETL doped with an alkali halide to have a thickness of 40 to 100 nm.

The forming of the organic layer may include forming at least one layer of an HIL, an HTL, an LEL and an EIL in addition to the ETL on the first electrode. In the case of the organic layer, the EIL may be omitted, or the EIL and ETL may be formed as one layer. For example, the organic layer may be composed of the HIL, the HTL, the LEL and the ETL. In this case, a case in which the EIL is formed as a separate layer is not excluded in the present invention. Also, the organic layer including the LEL may be repeatedly formed in a 2-stacked or 3-stacked structure.

A method of stacking the respective layers constituting an organic electronic device may be performed using methods known in the related art. For example, a method such as a deposition method or a solvent process may be applicable. Here, examples of the solvent process include a spin coating, dip coating, doctor blading, screen printing, inkjet printing or thermal transfer method.

Also, the ETL doped with the alkali halide may be formed to have a thickness of 40 to 100 mm, more particularly, a thickness of 55 to 85 nm thickness. The organic electronic device according to one exemplary embodiment of the present invention may be manufactured using methods and materials known in the related art, except that the above-described ETL doped with the alkali halide is formed to have a thickness of 40 to 100 nm or 55 to 85 nm. For example, the organic electronic device according to one exemplary embodiment of the present invention may include a second electrode. Here, the second electrode may be formed by depositing a metal, a conductive metal oxide or an alloy thereof on a first ITO electrode having an organic layer formed thereon, using a physical vapor deposition (PVD) method such as sputtering or e-beam evaporation.

The organic electronic device according to one exemplary embodiment of the present invention includes an organic layer formed on the substrate. The respective layers constituting the organic layer will be described in further detail, as follows.

HIL or HTL

An HIL or HTL is formed between an anode and an LEL to facilitate the transfer of holes. For example, the material constituting the HIL or HTL that may be used herein may include N,N'-diphenyl-N—N'-di(1-naphthyl)-benzidine (NPD), N,N'-diphenyl-N,N'-di(3-toly)-benzidine (TPD) or N,N'-diphenyl-amino)phenyl-N,N'-diphenylbenzidine (DNTPD).

LEL

The transfer of holes and electrons takes place at the LEL at the same time. For the sake of convenience, when the electron transfer is carried out at a higher rate than the hole transfer, the LEL may be classified into an n-type LEL, whereas, when the hole transfer is carried out at a higher rate than the electron transfer, the LEL may be classified into a p-type LEL.

Since the electron transfer is carried out at a higher rate than the hole transfer in the n-type LEL, light emission takes place around the interface between the HTL and the LEL. As a result, when the HTL has a higher lowest unoccupied molecular orbital (LUMO) level than the LEL, better light emission efficiency may be realized. For example, the n-type LEL includes tris(8-hydroxyquinoline)aluminum ($Alq_3$), 8-hydroxyquinoline beryllium (BAlq), a benzoxazoline-based, benzthiazole-based or benzimidazole-based compound, a polyfluorene-based compound, a silylcyclopentadiene-based compound, etc.

Since the hole transfer is carried out at a higher rate than the electron transfer in the p-type LEL, light emission takes place around the interface between the ETL and the LEL. As a result, when the ETL has a lower highest occupied molecular orbital (HOMO) level than the LEL, more excellent luminous efficiency may be realized. For example, the p-type LEL includes a carbazoline-based compound, an anthracene-based compound, a polyphenylene vinylene (PPV)-based polymer, or a spiro compound.

ETL or EIL

The ETL or EIL may be formed of a material having high electron mobility so as to effectively transfer electrons injected from a cathode to the LEL. The ETL or EIL is not particularly limited, but includes an organic compound having an $Alq_3$ structure, a hydroxyflavone-metal complex compound, or a silylcyclopentadiene-based compound. Also, tris (8-hydroxyquinoline)aluminium ($Alq_3$), Bphen (4,7-diphenyl-1,10-phenanthroline) or 2,9-dimethyl-4,7-diphenyl-1,10-phenanthroline (BCP) may be, for example, used as the ETL.

Hereinafter, the present invention will be described in further detail with reference to the accompanying drawings. However, it should be understood that the exemplary embodiments of the present invention are note intended to limit the scope of the present invention.

FIG. 1 schematically shows a stacked structure of a substrate for an organic electronic device according to one exemplary embodiment of the present invention. Referring to FIG. 1, the substrate for an organic electronic device 100 according to one exemplary embodiment of the present invention includes a scattering layer including a binder 21 and scattering particles 30 formed on a base substrate 10. Here, the scattering layer has an uneven structure formed on a surface thereof opposite the base substrate 10. A planarizing layer 22 is formed on the uneven structure of the scattering layer. An organic device may be further stacked on the flat surface planarized by the planarizing layer 22.

Figure 2:
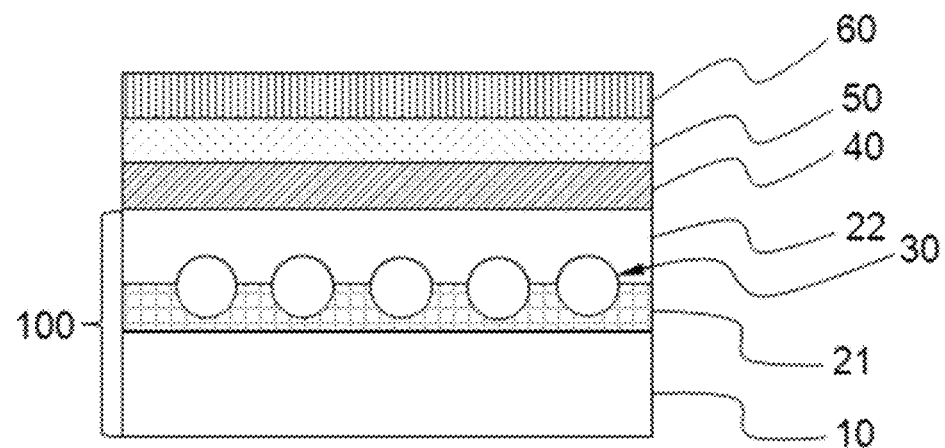
FIG. 2 is a schematic diagram showing a cross section of an organic electronic device according to one exemplary embodiment of the present invention.

FIG. 2 schematically shows a stacked structure of an organic electronic device including the substrate for an organic electronic device according to one exemplary embodiment of the present invention. Referring to FIG. 2, the organic electronic device may be formed by sequentially forming a first electrode 40, an organic layer 50 including an LEL, and a second electrode 60 on the substrate 100 manufactured as shown in FIG. 1. The organic electronic device may further include an additional stacked structure to improve device characteristics, as necessary.

Figure 3:
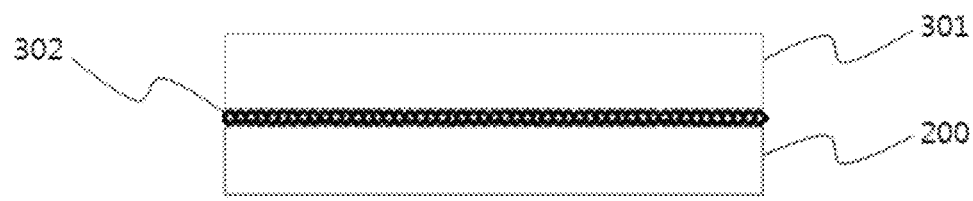
FIG. 3 is a schematic diagram showing a configuration in which an ETL and an EIL are formed on an electrode as one layer.

FIG. 3 is a schematic diagram showing a configuration in which the ETL and the EIL are formed on an electrode. An EIL 302 may be further provided in addition to an ETL 301 so as to facilitate injection of electrons generated in an electrode 200 into an LEL.

Figure 4:
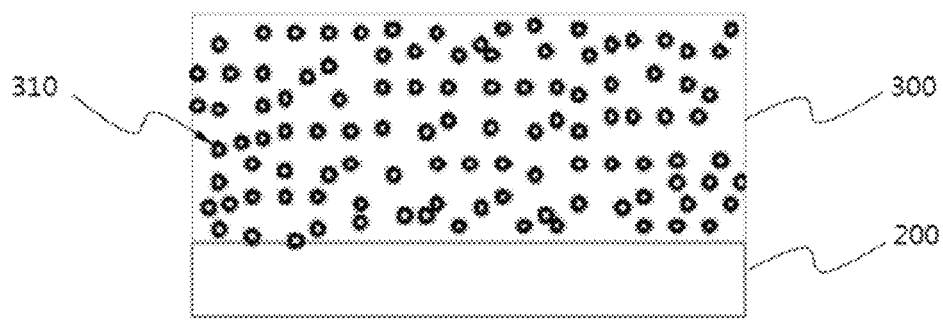
FIG. 4 is a schematic diagram showing a configuration in which an ETL is formed on an electrode according to one exemplary embodiment of the present invention.

Therefore, according to one exemplary embodiment of the present invention, electron transfer characteristics may be improved without using a separate EIL by forming a thick ETL 300 doped with an alkali halide 310 on the electrode 200, as shown in FIG. 4. The ETL 300 may be formed to have a thickness of 50 to 100 nm.

Furthermore, the present invention provides an electronic device including the organic electronic device as described above. The electronic device is not particularly limited, and, for example, includes lighting equipment or a display device.

Hereinafter, the present invention will be described in further detail with reference to the following examples. However, it should be understood that the examples of the present invention are not intended to limit the scope of the present invention.

Example 1

Manufacture of Substrate for an Organic Electronic Device 1 g of polymer beads (XX75BQ, diameter of 3 μm, commercially available from Sekisui) having a refractive index of approximately 1.52 was thoroughly dispersed in 10 g of TMOS ($Si(OCH_3)_4$, siloxane) to prepare a coating solution. A glass substrate was coated with the polymer bead-dispersed coating solution. The coated coating solution was cured to form a scattering layer. Also, the scattering layer was coated with an inorganic binder (siloxane) having a high-refractive index filler (titanium dioxide) dispersed therein, and then dried to manufacture a substrate for an organic electronic device having a planarizing layer formed thereon. In this case, the substrate for an organic electronic device was manufactured so that a difference in refractive index between the planarizing layer and the polymer beads reached 0.4 by adjusting the content of the high-refractive index filler during formation of the planarizing layer.

Manufacture of OLED

A white OLED including a light-emitting region with a size of $2 \times 2$ mm$^2$ was manufactured by sequentially stacking a first transparent electrode, an organic layer, and a second electrode on the high-refractive index layer of the manufactured substrate for an organic electronic device. ITO was used for the first transparent electrode, and aluminum (Al) was used for the second electrode. Also, the organic layer was formed in a structure including an HIL, an HTL, an LEL, an ETL and an EIL. The material used in each of the stacked structures was a material generally used for the manufacture of a white organic electronic device, and a method of forming a stacked structure was also performed using a conventional method.

Example 2

A substrate was manufactured in the same manner as in Example 1, except that the scattering particles were used at an amount of 1.5 g, and the difference in refractive index between the polymer beads and the planarizing layer was adjusted to 0.8 during preparation of the coating solution. Thereafter, an organic electronic device was formed on the manufactured substrate.

Example 3

A substrate was manufactured in the same manner as in Example 1, except that TEOS ($Si(OC_2H_5)_4$, siloxane) was used as the binder during the manufacture of the substrate for an organic electronic device. Thereafter, an organic electronic device was manufactured using the manufactured substrate.

Comparative Example 1

A substrate was manufactured in the same manner as in Example 1, except that methyl methacrylate was used instead of the siloxane, and the difference in refractive index between the planarizing layer and the polymer beads was adjusted to 0.2 during the manufacture of the substrate for an organic electronic device. Thereafter, an organic electronic device was manufactured using the manufactured substrate.

Comparative Example 2

A substrate was manufactured in the same manner as in Example 1, except that the difference in refractive index between the planarizing layer and the polymer beads was adjusted to 0.2 during the manufacture of the substrate for an organic electronic device. Thereafter, an organic electronic device was manufactured using the manufactured substrate.

Experiment Example 1

Comparison of light extraction efficiency according to difference in refractive index between scattering particles and planarizing layer The organic electronic devices manufactured in Examples 1 and 2 and Comparative Example 1 were measured for light extraction efficiency with the purpose of comparison. More particularly, each of the organic electronic devices was driven under a drive condition such as a constant current of 0.4 mA, and the luminous flux of extracted light was measured to evaluate light extraction efficiency. The measurement results are listed in the following Table 1. In Table 1, Na represents a refractive index of scattering particle, Nb represents a refractive index of a planarizing layer, and N.A. means that there is no substantial difference in refractive index.

TABLE 1

| No. | Difference in refractive index (|Na-Nb|) | Luminous flux (lm) |
| --- | --- | --- |
| Control | N.A. | 0.060 |
| Comparative Example 1 | 0.2 | 0.071 |
| Example 1 | 0.4 | 0.077 |
| Example 2 | 0.8 | 0.083 |

Example 4

A transparent IZO first electrode having a thickness of 100 nm was formed on the substrate manufactured in Example 1 using a sputtering method. And an HIL having a thickness of 50 nm was formed by depositing a hexanitrile hexaazatriphenylene (HAT) material under a thermal vacuum. An HTL having a thickness of 40 nm was formed by vacuum-depositing N,N'-diphenyl-N—N'-di(1-naphthyl)-benzidine (NPD) on the HIL, and an LEL having a thickness of 30 nm was then formed by vacuum-depositing tris(8-hydroxyquinoline)aluminum ($Alq_3$). Thereafter, the manufactured ETL was formed to have a thickness of 55 nm by doping the tris(8-hydroxyquinoline)aluminum ($Alq_3$) with LiF at a content of 10% (w/w). An aluminum electrode having a thickness of 175 nm was formed on the ETL.

Examples 5 and 6

An organic electronic device was manufactured in the same manner as in Example 4, except that ETLs were formed to have thicknesses of 70 nm and 85 nm, respectively.

Comparative Example 3

An organic electronic device was manufactured in the same manner as in Example 4, except that an ETL was formed to have a thickness of 35 nm.

Comparative Example 4

An organic electronic device was manufactured in the same manner as in Example 4, except that an ETL was formed to have a thickness of 140 nm.

Experiment Example 2

Measurement of Light Emission Brightness

The organic electronic devices manufactured in Examples 4 to 6 and Comparative Examples 3 and 4 were measured for light emission brightness. Luminous intensity was determined by attaching a semi-spherical lens having a refractive index of 1.52 to a light emitting surface of an organic electronic device, and measuring the intensity of light emitted from the organic electronic device using an integrating sphere. The measurement results are shown in FIG. 5.

Figure 5:
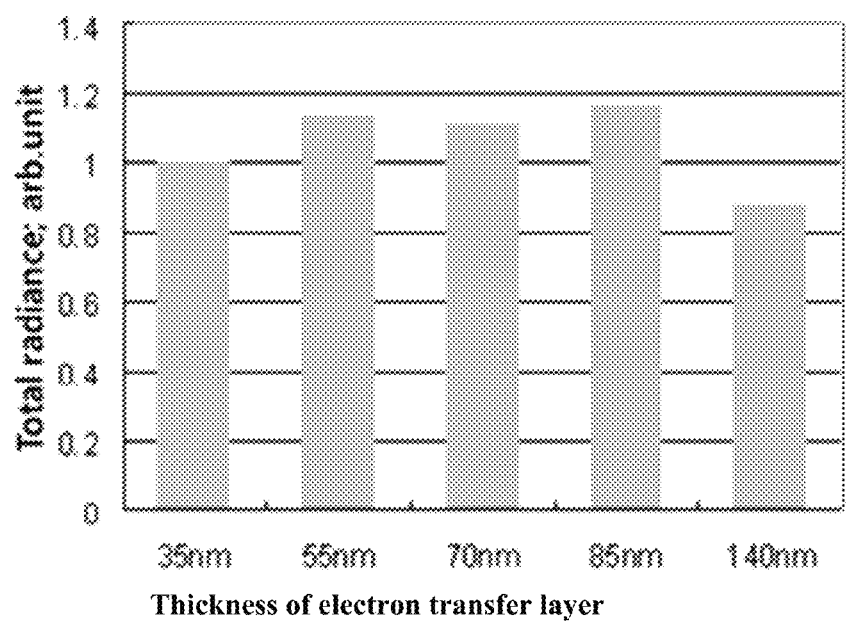
FIG. 5 is a graph plotted by measuring light emission brightness according to the thickness of the ETL.

Referring to FIG. 5, it could be seen that light emission brightness varied according to the thickness of the ETL. In the case of Examples 4 to 6 in which the prepared ETLs had thicknesses of 55, 70 and 85 nm, it was confirmed that the light emission brightness was higher than Comparative Examples 3 and 4 in which the prepared ETLs had thicknesses of 35 and 140 nm. Especially when the prepared ETL had a thickness of 85 nm, it was confirmed that the ETL had the highest light emission brightness.

The organic electronic device according to the present invention has advantages in that light-extraction efficiency can be improved and the manufacturing process can be simplified without degrading device performance, and thus can be widely applied in fields such as displaying or lighting.

As described above, the substrate for an organic electronic device according to the present invention can be useful in improving light extraction efficiency, and the organic electronic device including the substrate has advantages in that light-extraction efficiency can be improved and the manufacturing process can be simplified without degrading device performance.

What is claimed is:

1. A substrate for an organic electronic device comprising:
a base substrate;
a scattering layer which is formed on the base substrate, includes a binder and scattering particles for scattering light, and has an uneven structure formed on a surface thereof opposite the base substrate; and
a planarizing layer which is formed on the scattering layer to planarize an uneven surface of the scattering layer,
wherein a refractive index Na of the scattering particles and a refractive index Nb of the planarizing layer satisfy the expression |Na−Nb|≥0.3, and the refractive index Na of the scattering particles is in a range of 2.0 to 3.5 and the refractive index Nb of the planarizing layer is in a range of 1.7 to 2.5.

2. The substrate for an organic electronic device of claim 1, wherein the scattering particles are formed on the base substrate in a single-layer structure or a stacked structure including at most 5 layers.

3. The substrate for an organic electronic device of claim 1, wherein the scattering particles have an average diameter of 0.01 μm to 20 μm.

4. The substrate for an organic electronic device of claim 1, wherein the binder in the scattering layer is an inorganic binder or an organic/inorganic complex binder.

5. The substrate for an organic electronic device of claim 4, wherein the binder in the scattering layer is at least one selected from the group consisting of silicon oxide, silicon nitride, silicon oxynitride, alumina, and an inorganic or organic/inorganic complex based on a siloxane bond.

6. The substrate for an organic electronic device of claim 1, wherein the planarizing layer comprises an inorganic binder or an organic/inorganic complex binder.

7. The substrate for an organic electronic device of claim 6, wherein the inorganic binder or the organic/inorganic complex binder is at least one selected from the group consisting of silicon oxide, silicon nitride, silicon oxynitride, alumina, and an inorganic or organic/inorganic complex based on a siloxane bond.

8. The substrate for an organic electronic device of claim 6, wherein the planarizing layer further comprises a high-refractive index filler which is at least one selected from the group consisting of alumina, aluminum nitride, zirconium oxide, titanium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate and silicon nitride.

9. An organic electronic device having a sequentially stacked structure comprising:
the substrate for an organic electronic device of claim 1;
a first electrode;
an organic layer which comprises a light emitting layer and an electron transfer layer doped with an alkali halide, $MgF_2$ or $CaF_2$, wherein the doped electron transfer layer has a thickness of 40 to 100 nm; and
a second electrode.

10. The organic electronic device of claim 9, wherein the electron transfer layer includes an electron transfer material and an alkali halide, $MgF_2$, or $CaF_2$ with which the electron transfer material is doped, and
the electron transfer material includes a compound containing at least one functional group selected from the group consisting of an imidazole group, an oxazole group, a thiazole group, a quinoline and a phenanthroline group.

11. The organic electronic device of claim 9, wherein the alkali halide is at least one selected from the group consisting of NaF, CsF, LiF, and KF.

12. The organic electronic device of claim 9, wherein the alkali halide, $MgF_2$, or $CaF_2$ has a concentration gradient, depending on the thickness of the electron transfer layer.

13. The organic electronic device of claim 9, wherein introduction and transfer of electrons are simultaneously performed at the electron transfer layer.

14. The organic electronic device of claim 9, further comprising a metal wiring formed between the first electrode and the organic layer.

15. A method of manufacturing the organic electronic device of claim 9, comprising:
forming a first electrode;
forming an organic layer including a light emitting layer on the first electrode; and
forming a second electrode on the organic layer,
wherein the forming of the organic layer includes forming an electron transfer layer doped with an alkali halide, $MgF_2$, or $CaF_2$ to a thickness of 40 to 100 nm.

16. The method of claim 15, wherein the forming of the organic layer includes forming at least one of a hole injection layer, a hole transfer layer, and an electron injection layer on the first electrode in addition to the electron transfer layer.

17. The organic electronic device of claim 9, wherein the doped electron transfer layer has a thickness of 55 to 85 nm.

18. A method of manufacturing the substrate for an organic electronic device of claim 1, comprising:
forming the scattering layer on the base substrate using a coating solution including the binder and the scattering particles; and
forming the planarizing layer on the formed scattering layer to have a planarized surface.

* * * * *